United States Patent
Van Schoot et al.

(10) Patent No.: US 8,570,489 B2
(45) Date of Patent: Oct. 29, 2013

(54) LITHOGRAPHIC PROJECTION APPARATUS AND METHOD OF COMPENSATING PERTURBATION FACTORS

(75) Inventors: Jan Bernard Plechelmus Van Schoot, Eindhoven (NL); Antonius Johannes Josephus Van Dijsseldonk, Hapert (NL); Hans Van Der Laan, Veldhoven (NL); Diederik Jan Maas, Breda (NL)

(73) Assignee: ASML Netherlands B.V., Veldhoven (NL)

(*) Notice: Subject to any disclaimer, the term of this patent is extended or adjusted under 35 U.S.C. 154(b) by 550 days.

(21) Appl. No.: 12/741,960

(22) PCT Filed: Nov. 7, 2008

(86) PCT No.: PCT/NL2008/050708
§ 371 (c)(1),
(2), (4) Date: Sep. 3, 2010

(87) PCT Pub. No.: WO2009/061196
PCT Pub. Date: May 14, 2009

(65) Prior Publication Data
US 2010/0321657 A1    Dec. 23, 2010

Related U.S. Application Data

(60) Provisional application No. 60/996,277, filed on Nov. 8, 2007.

(51) Int. Cl.
*G03B 27/32* (2006.01)
*G03B 27/42* (2006.01)
*G03B 27/54* (2006.01)

(52) U.S. Cl.
USPC .............................. 355/67; 355/53; 355/77

(58) Field of Classification Search
CPC ............ G03F 7/70325; G03F 7/70425; G03F 7/7045; G03F 7/70458; G03F 7/70466
USPC ................. 355/53, 67, 71, 77; 430/5, 30, 396
See application file for complete search history.

(56) References Cited

U.S. PATENT DOCUMENTS

| | | | |
|---|---|---|---|
| 2006/0132749 A1 | 6/2006 | Bruls et al. | |
| 2007/0008510 A1* | 1/2007 | Takizawa | 355/69 |
| 2007/0046921 A1* | 3/2007 | Takahashi et al. | 355/71 |
| 2010/0079741 A1* | 4/2010 | Kraehmer et al. | 355/71 |

FOREIGN PATENT DOCUMENTS

| | | |
|---|---|---|
| EP | 1 619 556 A1 | 1/2006 |
| JP | 60035516 A | 2/1985 |
| JP | 60107835 A | 6/1985 |

OTHER PUBLICATIONS

International Search Report for International Application No. PCT/NL2008/050708.

* cited by examiner

*Primary Examiner* — Toan Ton
*Assistant Examiner* — Colin Kreutzer
(74) *Attorney, Agent, or Firm* — Pillsbury Winthrop Shaw Pittman LLP

(57) ABSTRACT

A lithographic projection apparatus including a support structure configured to support a patterning device, the patterning device configured to impart a beam of radiation with a pattern in its cross-section; a substrate holder configured to hold a substrate; a projection system configured to expose the patterned beam of radiation on a target portion of the substrate; and a system configured to compensate one or more perturbation factors by providing an additional beam of radiation to be exposed on the target portion of the substrate, the additional beam of radiation being imparted in its cross-section with an additional pattern which is based on the pattern of the patterning device and on lithographic projection apparatus property data, the lithographic projection apparatus property data characterizing a level and nature of one or more systematic perturbation factors of different lithographic apparatus.

24 Claims, 5 Drawing Sheets

LITHOGRAPHIC PROJECTION APPARATUS AND METHOD OF COMPENSATING PERTURBATION FACTORS

CROSS-REFERENCE TO RELATED APPLICATIONS

This is the U.S. National Stage of PCT/NL2008/050708, filed Nov. 7, 2008, which in turn claims priority to U.S. Provisional Application No. 60/996,277, filed Nov. 8, 2007, the entire contents of both applications are incorporated herein by reference.

FIELD

The present invention relates to a lithographic projection apparatus, a device manufacturing method using the lithographic projection apparatus and a computer readable medium comprising computer executable code enabling such a device manufacturing method. The invention further relates to a method of compensating perturbation factors in a lithographic projection apparatus, and a computer readable medium comprising computer executable code to enable such a method of compensating perturbation factors.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In device manufacturing methods using lithographic projection apparatus, an important factor is accuracy. A pattern of a patterning device being projected onto a target portion of a substrate will generally not result in a miniaturized desired version of the pattern on the substrate. Causes include a non-uniform source-power spectrum, resist sensitivity characteristics and stray radiation, the latter also referred to as flare. These sources of perturbation may result in an overexposure, i.e. a dose which is too high, for a certain type of structure e.g. a dense pattern and an underexposure, i.e. a dose which is too low, for a different type of structure, e.g. an isolated feature. Many systematic perturbation factors may have an impact on the long range dose, i.e. they have an influence on the substrate over distances on the substrate to be exposed exceeding 1 mm. Examples of systematic perturbation factors include stray radiation and out-of-band radiation, i.e. radiation with a wavelength outside the actinic sensitivity range of resist provided on a substrate that is to be exposed.

SUMMARY

To overcome structure-dependent feature size variation due to one or more of the aforementioned or other systematic perturbation factors, the patterning device may be adjusted such that, for example, for a certain type of stray radiation pattern and/or a certain type of source-power spectrum, the desired dimensions are obtained on the target portion of the substrate. The adjustment is generally made for a specific level and set of the one or more systematic perturbation factors that are effective in a specific generation of lithographic systems. So, when an intensity or nature of one or more perturbation factors alters, a specific adjustment of the patterning device may be no longer adequate for obtaining desired dimensions on the target portion of the substrate.

With the continual desire to image ever smaller patterns to create a device with a higher component density, the optical performance of lithographic projection apparatus is improved, e.g. by upgrading the source and/or improving or adding optical elements within the projection optics. Such improvements may have an influence on the perturbation factors. For example, an improvement of optics within a lithographic projection apparatus may lead to a reduced stray radiation level. A patterning device designed for a lithographic projection apparatus with a certain stray radiation level may no longer be useable for an improved lithographic projection apparatus, i.e. an apparatus with a reduced stray radiation level, as the structure-dependent dose variation caused by stray radiation is different.

Patterning device costs typically increase with each "generation" of lithographic projection apparatus. Consequently, for example, manufacturing a new mask to enable exposure of an old pattern on an improved lithographic projection apparatus may become increasingly more costly.

It is desirable, for example, to provide a lithographic projection apparatus with the ability to use a patterning device designed for a different "generation" of lithographic projection apparatus.

To that end, according to an aspect of the invention, there is provided a lithographic projection apparatus comprising:

a support structure configured to support a patterning device, the patterning device configured to impart a beam of radiation with a pattern in its cross-section;

a substrate holder configured to hold a substrate;

a projection system configured to expose the patterned beam of radiation on a target portion of the substrate; and a system configured to compensate one or more perturbation factors by providing an additional beam of radiation to be exposed on the target portion of the substrate, the additional beam of radiation being imparted in its cross-section with an additional pattern which is based on the pattern of the patterning device and on lithographic projection apparatus property data, the lithographic projection apparatus property data characterizing a level and nature of one or more systematic perturbation factors of different lithographic apparatus.

In an embodiment, there is provided a device manufacturing method comprising projecting a patterned beam of radiation onto a substrate using the lithographic projection apparatus as described above.

In an embodiment, there is provided a computer readable medium comprising computer executable code, which, when loaded on a computer assembly, enables the computer assembly to control the device manufacturing method as described above.

In an embodiment, there is provided a method of compensating perturbation factors in a lithographic projection apparatus, preferably a lithographic apparatus as defined in the appended claims, the method comprising:

conditioning a beam of radiation;

imparting the beam of radiation with a pattern in its cross-section by using a patterning device so as to form a patterned beam of radiation;

projecting the beam of radiation onto a target portion of a substrate;

deriving an additional pattern based on the pattern of the patterning device and on lithographic projection apparatus property data, the lithographic projection apparatus property data characterizing a level and nature of one or more systematic perturbation factors of different lithographic apparatus;

conditioning an additional beam of radiation;

imparting the additional beam of radiation with the additional pattern in its cross-section so as to form an additional patterned beam of radiation; and projecting the additional patterned beam of radiation onto the target portion of the substrate.

In an embodiment, there is provided a computer readable medium comprising computer executable code, which, when loaded on a computer assembly, enables the computer assembly to control the method as described above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
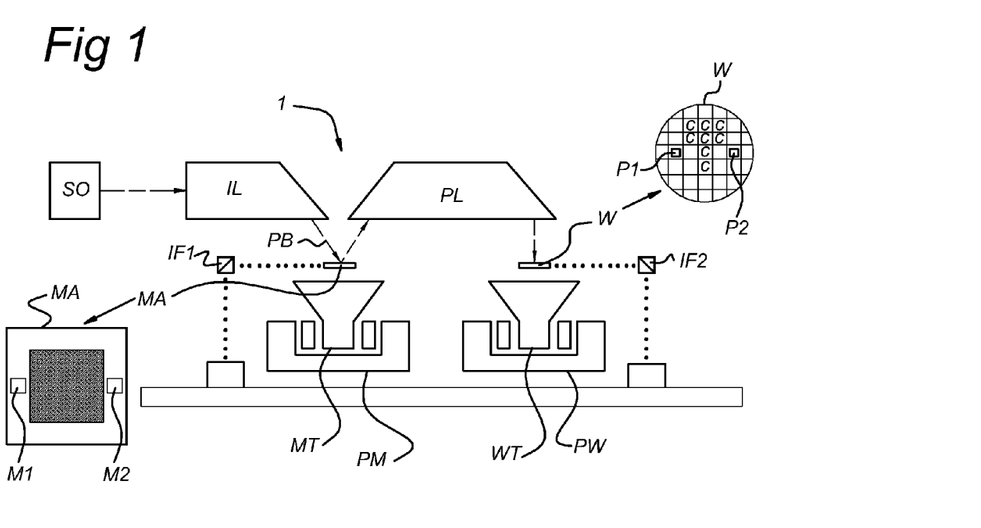
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or EUV-radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. Having traversed the patterning device MA, the radiation beam PB passes through the projection system PL, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam PB. Similarly, the first positioner PM and another position sensor IF1 can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
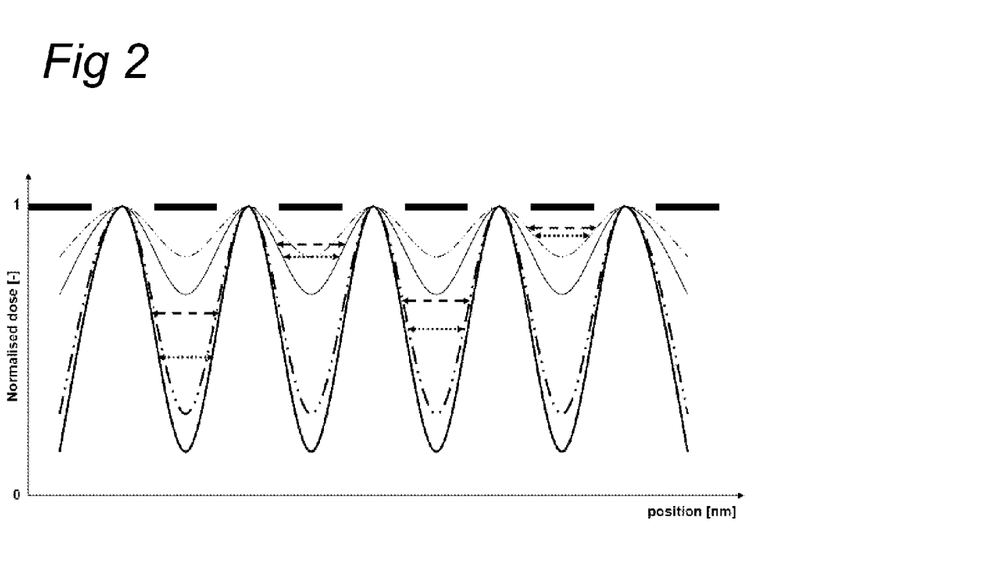
FIG. 2 schematically depicts a graph of normalized exposure dose on resist as a function of position for different stray radiation levels in best focus and large defocus.

FIG. 2 schematically depicts a graph of normalized exposed dose on resist as a function of position for different stray radiation levels in best focus and large defocus. The thick solid lines shown at a normalized dose level of 1, indicate an ideal image of part of a patterning device pattern of a structure with dense lines. The four oscillating lines represent the normalized exposed dose as function of position for a certain stray radiation level while the image to be exposed is in a certain focus position.

The resist is exposed in a lithographic projection apparatus. The dose is related to the wavelength used to expose the resist in the lithographic projection apparatus, i.e. the so-called actinic wavelength. Resist is predominantly sensitive for this wavelength, and may also be sensitive to wavelengths slightly different from the actinic wavelength, i.e. it is sensitive in an actinic region of wavelengths. Sometimes, the resist may also have a very limited sensitivity for wavelengths outside the aforementioned actinic region, i.e. so-called out-of-band radiation. Extensive exposure with out-of-band radiation could then have a non-negligible effect on the exposed dose.

Stray radiation, or flare, may be defined as radiation being scattered in random direction by an optical element, e.g. by lens surface roughness and/or an inhomogeneous lens material. Such radiation may either be within the visible range or not. The stray radiation exposes resist over a large area in accordance to a stray radiation pattern, so also resist at places where no exposure is desired. The resulting so-called background dose reduces contrast of a pattern to be exposed in resist.

In FIG. 2, the solid oscillating line shows the normalized dose as received by resist provided on the substrate to be patterned, from the aerial image of the pattern of the patterning device in absence of stray radiation at best focus. As can be seen in the graph, for dense lines, the minimum dose exceeds zero. This is due to the proximity of neighboring lines. The double arrows, shown at the left side of the graph indicate dose levels where the critical dimension (CD) in the resist deviates by 10 percent of the target CD, i.e. the upper, dashed double arrow representing a level where the CD is 10% larger than the target CD and the lower, dotted double arrow representing a level where the CD is 10% smaller than the target CD respectively. The difference in relative dose, i.e. percentage of the total dose, between the upper and lower CD-limit is defined as exposure latitude (EL). So, in case an upper limit of 110% target CD and a lower limit of 90% target CD is allowed as CD-variation, the EL in case of imaging without stray radiation in best focus is the difference between the most left upper and lower double arrows.

In an out-of-focus position, contrast in the aerial image on the resist is decreased, as is schematically depicted by the thin solid line in FIG. 2. Simultaneously, the EL is reduced significantly, as is schematically depicted by the two double arrows second from the left. Again, the upper, dashed double arrow represents the dose level for 110% of the target CD, while the lower, dotted double arrow represents the dose level for 90% of the target CD. Consequently, dose requirements are more stringent in case the image is out-of-focus.

The thick dash-dotted oscillating line, schematically depicted in FIG. 2, shows the normalized dose as received by resist provided on the substrate to be patterned, from the aerial image of the patterning device pattern in the presence of a certain amount of flare at best focus. It can be readily seen that contrast is less than the case in which no stray radiation is present. However, there is more contrast than in an out-of-focus position. The same accounts for the EL, as is shown in FIG. 2 by the two double-arrows second from the right.

Finally, the thin dash-dotted oscillating line, schematically depicted in FIG. 2, shows the normalized dose as received by resist provided on the substrate to be patterned, from the aerial image of the patterning device pattern in the presence of a certain amount of stray radiation in an out-of-focus position corresponding with the out-of-focus position as the case represented by the thin thick line. In the case of stray radiation and out-of-focus, the contrast is minimal and so is the EL, as is schematically shown in FIG. 2 by the outer right double arrows.

From FIG. 2 it follows that when a larger defocus is allowed, a budget for dose variation is reduced and vice versa. Furthermore, a high stray radiation level reduces the EL. It is therefore desired to minimize the stray radiation level in a lithographic projection apparatus.

Finally, the influence of stray radiation is different for different types of structure, e.g. dense lines versus isolated lines. Consequently, a unique stray radiation pattern develops for each pattern to be exposed.

A patterning device pattern is adjusted to compensate for stray radiation in accordance with a stray radiation profile. In the situation where the stray radiation level is reduced for a lithographic projection apparatus of a successive "generation", where the expression generation refers to a series of lithographic projection apparatus with similar characteristics, compatibility of a patterning device masks with a successive generation may not be possible. The stray radiation pattern for each generation differs. Thus, a correction for stray radiation made for a certain generation of lithographic projection apparatus may not apply to a succeeding generation of lithographic projection apparatus, the latter having an improved stray radiation level, i.e. less stray radiation. Especially with respect to a succeeding generation of EUV-lithographic projection apparatus, the aforementioned lack of compatibility may occur, as a typical stray radiation roadmap for this type of lithographic projection apparatus is 12% in 2009, 8% in 2011 and 4% in 2013.

Similarly, a patterning device may be adjusted to compensate for the non-uniform power-spectrum of a source of a specific type of lithographic projection apparatus. A source power spectrum may differ between succeeding generations of lithographic projection apparatus.

So, in addition to or alternatively to the desire to minimize stray radiation level in a lithographic projection apparatus, it is desirable to have a specific constant stray radiation pattern and/or source power spectrum when exposing a specific patterning device on the same or different lithographic apparatus.

Figure 3A:
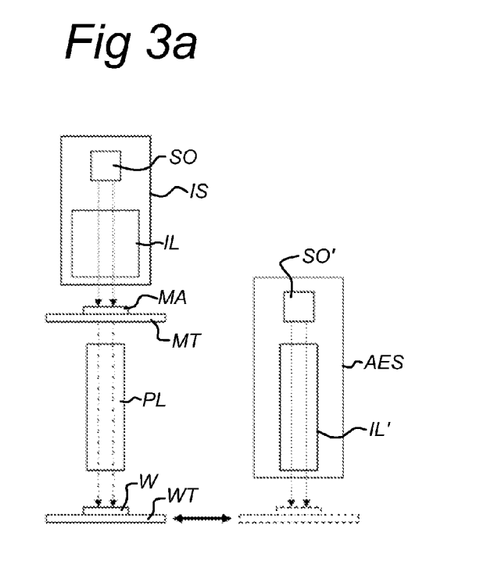
FIG. 3a schematically depicts a lithographic projection apparatus according to an embodiment of the invention.

As schematically depicted in FIG. 3a, a lithographic projection apparatus according to an embodiment of the invention comprises an illumination system IS, a support structure MT, a substrate holder WT, a projection system PL and a system AES configured to compensate for perturbation factors. The illumination system IS comprises a source SO and an illuminator IL. The illumination system IS is configured to provide a beam of radiation. The support structure MT is configured to support a patterning device (e.g., a mask) MA, that serves to impart the beam of radiation with a pattern in its cross-section. The substrate holder WT is configured to hold a substrate W. The projection system PL is configured to expose the patterned beam on the substrate W. Finally, the system AES is configured to compensate for perturbation factors by providing an additional beam of radiation to be exposed on the target portion of the substrate W. The additional beam of radiation is imparted in its cross-section with an additional pattern based on the pattern provided on the patterning device MA, and on lithographic projection apparatus property data. The lithographic projection apparatus property data are data characterizing a level and nature of one or more systematic perturbation factors of different lithographic apparatus. Lithographic projection apparatus property data may relate to properties like stray radiation profile and source power spectrum. In an embodiment of the invention, the additional pattern is further based on resist property data. The resist property data characterizes the resist that is provided on a target portion of the substrate to be exposed. The resist property data may comprise at least one resist property selected from a group consisting of contrast, sensitivity, and spectral response on actinic wavelength.

In the embodiment depicted in FIG. 3a, the system AES configured to compensate perturbation factors is an additional exposure system, which is positioned such that the target portion of the substrate W is exposed with the additional beam of radiation at a different location as compared to its position while being exposed by the beam of radiation originating from the projection system PL. The substrate table WT may be moved from a first position, i.e. a position suitable for exposure of the target portion of the substrate W thereon by the beam of radiation originating from the projection system PL, to a second position, i.e. a position suitable for exposure of the target portion of the substrate W thereon by the additional beam of radiation originating from the system AES configured to compensate for perturbation factors, and vice versa.

The wavelength used by the system AES to compensate for perturbation factors may be different from the wavelength used by the lithographic projection apparatus, i.e. the actinic wavelength. In an embodiment, the wavelength used by the system AES configured to compensate for perturbation factors is a wavelength within a range of 150-300 nm, more particularly at least one of 157 nm, 193 nm, and 248 nm. In such an embodiment, the actinic wavelength used by the lithographic apparatus is generally extreme ultraviolet radiation, i.e. radiation with a dominant wavelength between 10-20 nm, more particularly between 12-14 nm.

Figure 3B:
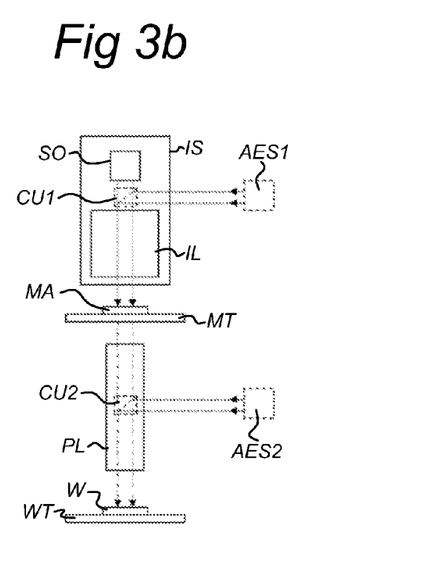
FIG. 3b schematically depicts a lithographic projection apparatus according to an embodiment of the invention.

FIG. 3b schematically depicts a lithographic projection apparatus according to an embodiment of the invention. In the embodiment depicted in FIG. 3b, the target portion of the substrate W can remain at the same position for exposure by the beam of radiation originating from the projection system PL and for exposure by the additional beam of radiation originating from the system AES configured to compensate for perturbation factors. For this purpose, the system AES configured to compensate for perturbation factors may use the projection system PL by coupling radiation originating from the system AES configured to compensate for perturbation factors into the optical pathway between the radiation source SO in the illumination system IS and the substrate W provided on the substrate table WT via a coupling unit CU1, CU2 in a way as known to a person skilled in the art.

As will be understood by a person skilled in the art, although in FIG. 3b two coupling units CU1, CU2 are depicted, in which each coupling unit corresponds to an system AES1, AES2 configured to compensate for perturbation factors respectively, it is just as possible to only use a single coupling unit CU1 or CU2 to couple in radiation originating from a single system AES1 or AES2 configured to compensate for perturbation factors respectively.

In an embodiment in which only system AES1 is used, the patterning device MA that is used for lithographic exposure by means of the aforementioned beam of radiation is also used for the additional exposure by means of the aforementioned additional beam of radiation to compensate differences in perturbation factors, e.g. differences in stray radiation pattern and source power spectrum. The wavelength used by the system AES1 configured to compensate for perturbation factors, may be different than the wavelength used by the source SO of the lithographic apparatus. In such a case, measures may be taken to adjust characteristics like the numerical aperture and appropriate defocus of the projection system PL. More details with respect to the latter will be provided with reference to FIGS. 4 and 5.

In an embodiment, the wavelength used by the system AES1 configured to compensate for perturbation factors is a wavelength from a range of 150-300 nm, more particularly at least one of 157 nm, 193 nm, or 248 nm. In such an embodiment, the wavelength used by the lithographic apparatus, i.e. the actinic wavelength, is generally extreme ultraviolet radiation, i.e. radiation with a dominant wavelength between 10-50 nm, more particularly between 12-14 nm.

In an embodiment in which only system AES2 is used, system AES2 comprises an additional patterning device. The additional patterning device comprises a pattern that may be used to compensate for systematic perturbation factors like flare.

In an embodiment, the wavelength used by the additional exposure system AES2, is different than the wavelength used by the source SO of the lithographic apparatus, i.e. the actinic wavelength. In such a case, measures may be taken to adjust an appropriate defocus of the projection system as will be discussed in more detail with reference to FIGS. 4 and 5.

In an embodiment, the wavelength used by the system AES2 configured to compensate for perturbation factors is a wavelength from a range of 150-300 nm, more particularly at least one of 157 nm, 193 nm, and 248 nm. In such an embodiment, the wavelength used by the lithographic apparatus, i.e. the actinic wavelength, is generally extreme ultraviolet radiation, i.e. radiation with a dominant wavelength between 1-50 nm, more particularly between 12-14 nm.

Figure 4:
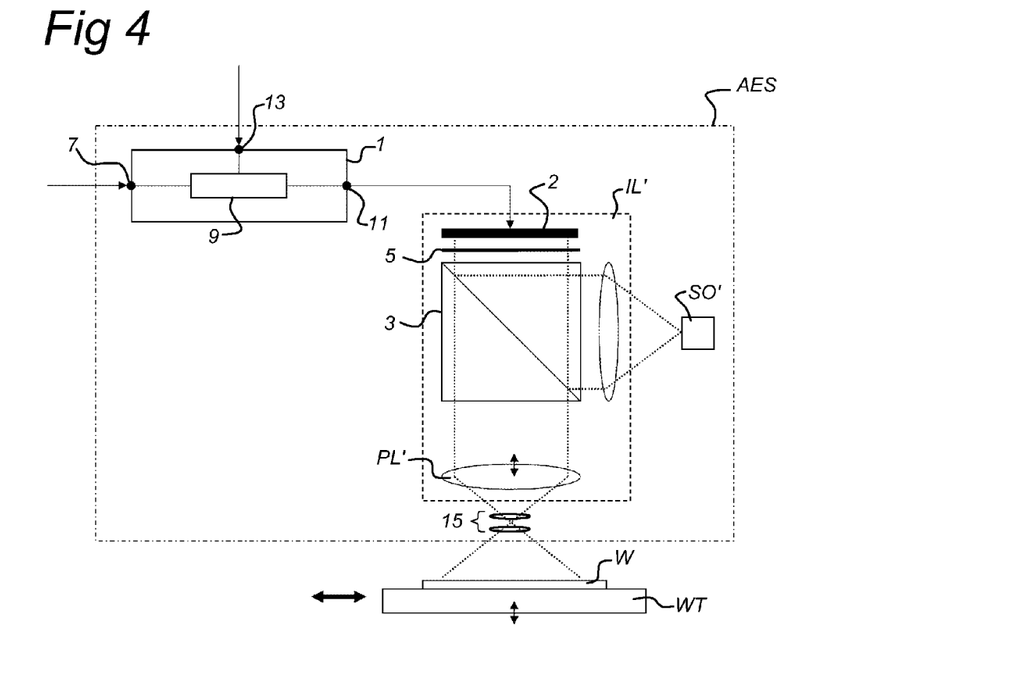
FIG. 4 schematically depicts an embodiment of an additional exposure system that may be used in an embodiment of the invention.

FIG. 4 schematically depicts an embodiment of a system configured to compensate for perturbation factors that may be used in an embodiment of the invention, e.g. an additional exposure system that may be used in a lithographic projection apparatus as schematically depicted in FIG. 3a.

In this embodiment, the system AES configured to compensate for perturbation factors comprises a source SO', an additional illuminator IL' and a control unit 1. The additional illuminator IL' comprises a programmable radiation modulation array 2, e.g. a deformable mirror device (DMD). The control unit 1 is configured to control the programmable radiation modulation array 2 based on the pattern provided by the patterning device MA. In this embodiment the additional illuminator IL' further comprises a polarizing beam splitter 3 and a quarter-wavelength (lambda/4) plate 5 in combination with the programmable radiation modulation array 2 to condition the additional beam of radiation. Finally, in the embodiment depicted in FIG. 4, the system AES configured to compensate for perturbation factors comprises projection optics PL' to project the image provided by the programmable radiation modulation array 2 onto a target portion of the substrate W provided on the substrate table WT. In case of compensation of differences in stray radiation pattern, it may be desirable to project the image provided by the programmable radiation modulation array 2 on the target portion of the substrate W far out-of-focus in order to mimic a stray radiation circle diameter. To accomplish suitable focus settings a distance between the projection optics PL' and the substrate table WT provided with the substrate W may be adjusted. This can be done by moving the projection optics PL' and/or the substrate table WT in a direction towards or away from the other, or alternatively, by altering the distance between the projection optics PL' and the substrate WT by moving them simultaneously with respect to each other.

Additionally, or alternatively, the projection system PL' may comprise a zoom condenser lens 15, the zoom condenser lens 15 comprising at least two moveable lenses. The zoom condenser is positioned between the programmable radiation modulation array 2 and the target portion of the substrate W. The zoom condenser lens 15 is configured to adjust a magnification of the patterned additional beam of radiation. By a concerted movement of the at least two moveable lenses with respect to each other, the projected image remains in focus at substrate level, while image magnification is adjusted. Consequently, a desired setting with respect to systematic perturbation factors like stray radiation can be established.

The control unit 1 may comprise an input 7, a processor 9 and an output 11. The input 7 may be configured to receive pattern data, e.g. Graphic Design System II (GDSII) data, Graphic Design System II being a data format used to represent structures to be exposed on a substrate, based on the pattern of the patterning device MA. The processor 9 may be configured to calculate radiation modulation data on the basis of the pattern data. The output 11 may be configured to send the radiation modulation data to the programmable radiation modulation array 2.

In an embodiment, the control unit 1 further comprises an additional input 13. The additional input 13 may be configured to receive lithographic projection apparatus property data. In this embodiment, the processor 9 may be configured to calculate the radiation modulation data on the basis of the pattern data and the lithographic projection apparatus property data. The lithographic projection apparatus property data relates to at least one property of the lithographic projection apparatus e.g. a stray radiation profile and/or a source power spectrum of the lithographic projection apparatus.

The additional input 13 may further, or alternatively, be configured to receive resist property data. The resist property data characterizes the resist that is provided on a target portion of the substrate to be exposed. The resist property data may comprise at least one resist property selected from a group consisting of contrast, sensitivity, or spectral response on actinic wavelength.

As will be understood by a person skilled in the art, the embodiment of the system AES configured to compensate for perturbation factors as schematically depicted in FIG. 4, may, e.g. via one or more coupling units as schematically depicted in FIG. 3b, be coupled into the optical pathway between a source SO and substrate W provided on a substrate table WT in a lithographic projection apparatus.

Figure 5:
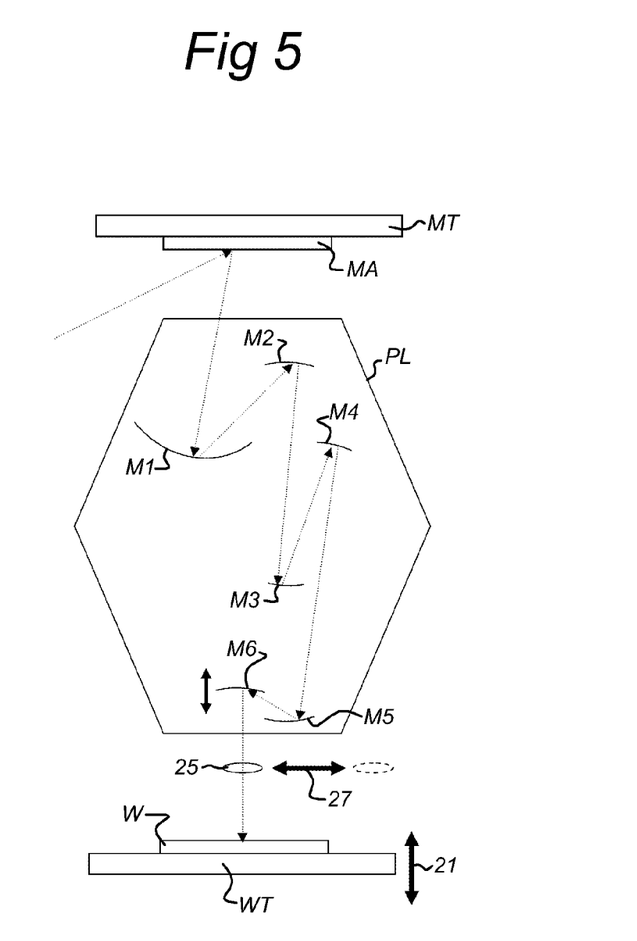
FIG. 5 schematically depicts a detail of a lithographic projection apparatus according to an embodiment of the invention.

FIG. 5 schematically depicts a detail of a lithographic projection apparatus using an embodiment of the invention.

In the embodiment shown, a reflective lithographic projection apparatus is used, e.g. a lithographic projection apparatus using EUV-radiation. In such a lithographic projection apparatus, the projection system PL comprises a number of mirrors, in FIG. 5 six mirrors indicated as M1-M6 respectively. Radiation originating from the illumination system as well as radiation originating from the system configured to compensate for perturbation factors falls on the patterning device MA at a predetermined angle and is reflected towards the projection system PL. The radiation path of the beam of radiation originating from the illumination system, i.e. the aforementioned beam of radiation, and the additional beam of radiation originating from the system configured to compensate for perturbation factors is schematically depicted by the dotted arrows.

The embodiment shown in FIG. 5 may use a coupling unit outside the projection system, e.g. coupling unit CU1 as schematically depicted in FIG. 3b to couple the additional beam of radiation into the projection system. Alternatively or additionally, the additional beam of radiation may be conditioned by out-of-band radiation emitted by the source of the lithographic projection apparatus, e.g. source SO in FIG. 3b. In the latter case, no coupling unit has to be used.

Both the beam of radiation and the additional beam of radiation may be exposed simultaneously. Alternatively or additionally, they may be exposed subsequently. In order to adjust dose level during exposure, an exposure step may be added in which only the additional beam of radiation is used. In case of compensation for differences in stray radiation pattern, it may be desirable to project the patterning device MA on the target portion of the substrate W far out-of-focus in order to mimic a stray radiation circle diameter. To accomplish an out-of-focus exposure several measures may be taken. In an embodiment, the substrate table WT may be moved out of focus, schematically indicated by double arrow 21. In an embodiment, mirror M6 may be moved out of focus, schematically indicated by double arrow 23. In an embodiment, an additional optical element 25 may be moved into the optical pathway, schematically indicated by double arrow 27. The additional optical element 25 may be a positive lens, a negative lens or an optical element configured to be substantially transparent for a first type of radiation and substantially non-transparent for a second type of radiation. The first type of radiation may be radiation with a wavelength between 100 nm and 300 nm, while the second type of radiation may be EUV-radiation, i.e. radiation with a wavelength between 5 nm and 50 nm, more particularly between 12 nm and 15 nm. Of course it may be possible to use a combination of aforementioned measures to establish an out-of-focus image of the patterning device pattern on the target portion of the substrate.

Figure 6:
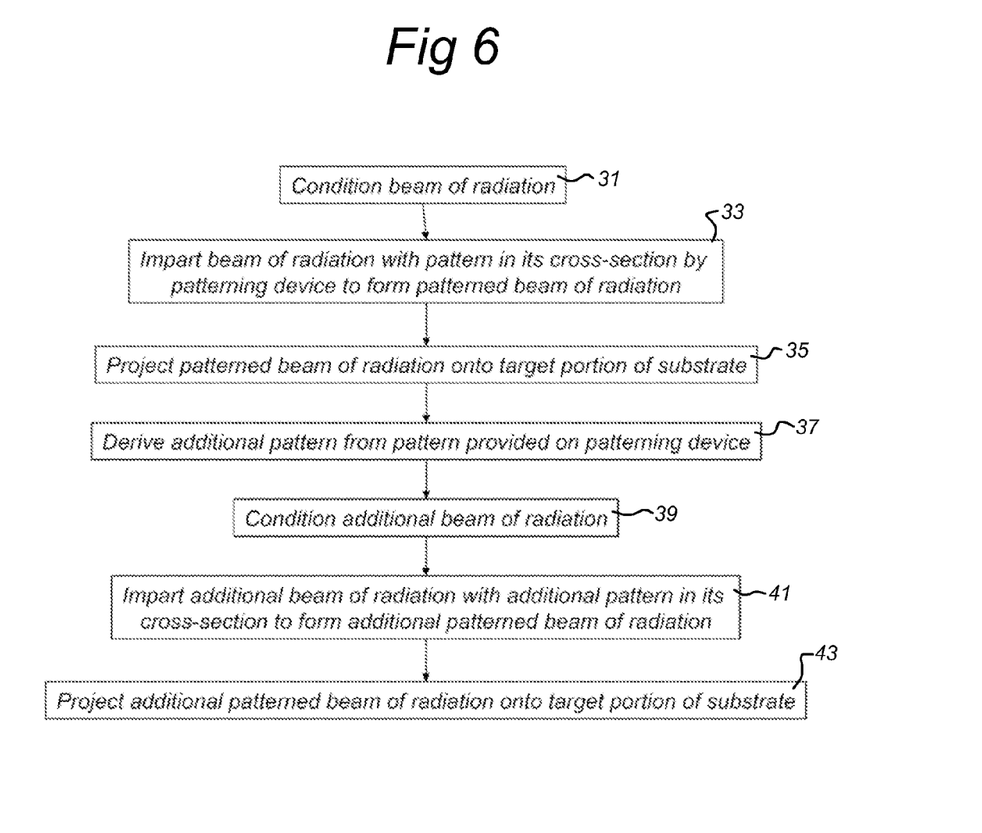
FIG. 6 depicts a flow chart of a method of compensating perturbation factors in a lithographic projection apparatus according to an embodiment of the invention.

FIG. 6 depicts a flow chart of a method of compensating perturbation factors in a lithographic projection apparatus according to an embodiment of the invention. First, in action 31, a beam of radiation is conditioned, e.g. by an illumination system. Subsequently, in action 33, the beam of radiation is imparted with a pattern in its cross-section by a patterning device, e.g. a mask, to form a patterned beam of radiation. The patterned beam of radiation may then, in action 35, be projected onto a target portion of the substrate by means of a projection system.

In action 37, an additional pattern is derived from the pattern provided on the patterning device. For this purpose, a processor may be used, e.g. a processor in a computer assembly as described with reference to FIG. 7. The deriving of the additional pattern may be performed simultaneously, before or after the conditioning of the beam of radiation in action 31 as will be understood by a person skilled in the art.

In an embodiment, deriving an additional pattern includes receiving of pattern data and calculating radiation modulation data on the basis of the pattern data. The pattern data may be GDSII data. The radiation modulation data is suitable to form the aforementioned additional pattern, e.g. by means of a programmable patterning device or the like. Calculating radiation modulation data may include performing a Fourier transform on the pattern data to form transform data, passing the transform data through a low-pass filter so as to form low-pass transform data and performing an inverse Fourier transform on the low-pass transform data to form the aforementioned radiation modulation data. After passing the low-pass filter, in an embodiment, the calculating alternatively includes providing a stray radiation profile, calculating further low-pass transform data based on the low-pass transform data and the stray radiation profile, and performing an inverse Fourier transform on the further low-pass transform data to form the radiation modulation data.

After deriving an additional pattern in action 37, in action 39, an additional beam of radiation is conditioned by, e.g., an additional exposure system. The additional beam of radiation may be conditioned simultaneously with the conditioning of the beam of radiation by the illumination system in action 31. Alternatively, conditioning an additional beam of radiation may be a subsequent action of the projecting of the patterned beam of radiation originating from the illumination system via the patterning device and projection system.

Subsequently, in action 41, the additional beam of radiation is imparted with the additional pattern in its cross-section so as to form an additional patterned beam of radiation. Finally, in action 43, the additional patterned beam of radiation is projected onto the target portion of the substrate.

In an embodiment, actions 37, 39, 41 and 43 are performed before or at the same time as the conditioning a beam of radiation in action 31. In this embodiment, the time which elapses between exposure by the beam of radiation and a post-exposure bake remains more or less constant, i.e. it does not depend on whether or not or to what extent an exposure by means of the additional patterned beam of radiation is necessary.

Figure 7:
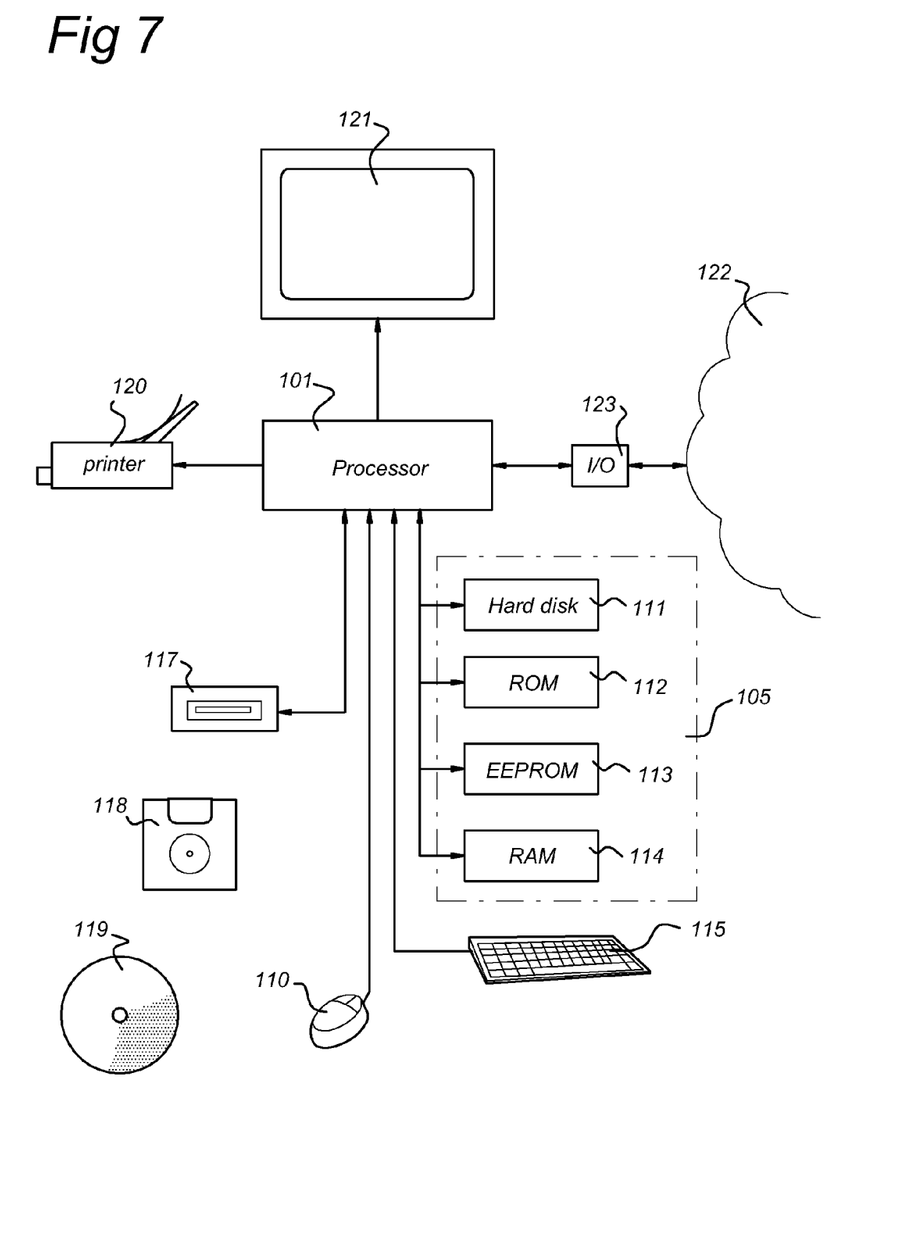
FIG. 7 schematically depicts an embodiment of a computer assembly that may be used by a lithographic projection apparatus according to embodiments of the present invention.

FIG. 7 schematically depicts an embodiment of a computer assembly 100 that may be used by a lithographic projection apparatus according to an embodiment of the present invention. Such a computer assembly 100 may be a dedicated computer in the form of a control unit, e.g. control unit 1 schematically depicted in FIG. 4. The computer assembly 100 may be a central computer controlling the lithographic projection apparatus. The computer assembly 100 may be arranged for loading or include a computer readable medium comprising computer executable code. This may enable the computer assembly 100 to execute, when the computer readable medium is loaded or included, an embodiment of the aforementioned method of compensating perturbation factors in a lithographic projection apparatus. Additionally or alternatively, this may enable the computer assembly 100 to execute, when the computer readable medium is loaded or included, a device manufacturing method in which a target portion of a substrate is patterned by means of a lithographic projection apparatus according to an embodiment of the invention, e.g. an embodiment as described with reference to FIGS. 3-5.

The computer assembly 100 comprises a processor 101, e.g. processor 9 in control unit 1, and may further comprise a memory 105. The memory 105, which is connected to processor 101, may comprise computer readable medium such as a hard disk 111, Read Only Memory (ROM) 112, Electrically Erasable Programmable Read Only Memory (EEPROM) 113 and/or Random Access Memory (RAM) 114. Not all the aforementioned memory components need be present. Furthermore, it is not essential that aforementioned memory components are physically in close proximity to the processor 101 or to each other. They may be located at a distance away from each other.

The processor 101 may also be connected to some kind of user interface, for instance a keyboard 115 or a mouse 116. A touch screen, track ball, speech converter or other interface that is known to persons skilled in the art may be used.

The processor 101 may be connected to a reading unit 117, which is arranged to read data, e.g. in the form of computer executable code, from and under some circumstances store data on a computer readable medium, like a floppy disc 118 or a CD-ROM 119. A DVD or other computer readable medium known to persons skilled in the art may be used.

The processor 101 may also be connected to a printer 120 to print out output data on paper as well as to a display 121, for example a monitor, such as a liquid crystal display, or any other type of display known to a person skilled in the art.

The processor 101 may be connected to a communications network 122, for instance a public switched telephone network (PSTN), a local area network (LAN), a wide area network (WAN) etc. by means of a transmitter/receiver responsible for input/output (I/O) 123. The processor 101 may be arranged to communicate with another communication system via the communications network 122. In an embodiment, an external computer (not shown), for instance a personal computer of an operator, can log into the processor 101 via the communications network 122.

The processor 101 may be implemented as an independent system or as a number of processing units that operate in parallel, wherein each processing unit is arranged to execute sub-tasks of a larger program. The processing units may also be divided in one or more main processing units with one or more subprocessing unit. A processing unit of the processor 101 may even be located a distance away of another processing unit and communicate via communications network 122.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" and "target portion", respectively. The substrate referred to herein may be processed before or after exposure, in for example a track (a tool that typically applies a layer of resist to a substrate and develops the exposed resist), a metrology tool and/or an inspection tool. where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:
1. A lithographic projection apparatus comprising:
   a support structure configured to support a patterning device, the patterning device configured to impart a beam of radiation with a pattern in its cross-section;
   a substrate holder configured to hold a substrate;
   a projection system configured to expose the patterned beam of radiation on a target portion of the substrate; and
   a system configured to compensate one or more perturbation factors, the system comprising an additional exposure system configured to provide an additional beam of radiation to be exposed on the target portion of the substrate, the additional beam of radiation being imparted in its cross-section with an additional pattern which is based on the pattern of the patterning device and on lithographic projection apparatus property data, the lithographic projection apparatus property data characterizing a level and nature of one or more systematic perturbation factors of a different lithographic apparatus.

2. The lithographic projection apparatus according to claim 1, wherein the system is configured to compensate one or more perturbation factors by moving an element within the lithographic projection apparatus to cause out-of-focus projection of the patterned additional beam on the target portion of the substrate.

3. The lithographic projection apparatus according to claim 2, wherein the element which is to be moved by the system comprises the substrate holder.

4. The lithographic projection apparatus according to claim 2, wherein the element which is to be moved by the system comprises an optical element in the projection system.

5. The lithographic projection apparatus according to claim 1, wherein the system configured to compensate one or more perturbation factors comprises a further optical element configured to be moved from and to a location between the projection system and the substrate holder, the further optical element being substantially transmissive for a first type of radiation and substantially non-transmissive for a second type of radiation.

6. The lithographic projection apparatus according to claim 5, wherein the first type of radiation has a wavelength between 100 nm and 300 nm, and the second type of radiation has a wavelength between 5 nm and 50 nm.

7. The lithographic projection apparatus according to claim 1, wherein the additional beam of radiation is a beam of extreme ultraviolet radiation.

8. The lithographic projection apparatus according to claim 1, wherein the additional exposure system comprises a programmable radiation modulation array and a control unit, the control unit configured to control the programmable radiation modulation array based on the pattern of the patterning device and on the lithographic projection apparatus property data.

9. The lithographic projection apparatus according to claim 8, wherein the control unit comprises:
  an input configured to receive pattern data based on the pattern of the patterning device;
  a further input configured to receive lithographic projection apparatus property data;
  a processor configured to calculate radiation modulation data on the basis of the pattern data and the lithographic projection apparatus property data; and
  an output configured to provide the radiation modulation data to the programmable radiation modulation array.

10. The lithographic projection apparatus according to claim 9, wherein the further input is further configured to receive resist property data, the resist property data characterizing resist provided on the target portion of the substrate, and the processor is configured to calculate the radiation modulation data on the basis of the pattern data, the lithographic projection apparatus property data and the resist property data.

11. The lithographic projection apparatus according to claim 10, wherein the resist property data comprises at least one resist property selected from a group consisting of contrast, sensitivity, and spectral response on actinic wavelength.

12. The lithographic projection apparatus according to claim 1, wherein the additional exposure system further comprises a zoom-condensor lens configured to adjust a magnification of the patterned additional beam of radiation.

13. The lithographic projection apparatus according to claim 1, wherein the lithographic projection apparatus property data relate to at least one property of the lithographic projection apparatus selected from a group consisting of stray radiation profile and source power spectrum.

14. A device manufacturing method comprising projecting a patterned beam of radiation onto a substrate using the lithographic projection apparatus as defined by claim 1.

15. A non-transitory computer readable medium comprising computer executable code, which, when loaded on a computer assembly, enables the computer assembly to control the device manufacturing method according to claim 14.

16. A method of compensating perturbation factors in a lithographic projection apparatus, the method comprising:
  conditioning a beam of radiation;
  imparting the beam of radiation with a pattern in its cross-section by using a patterning device so as to form a patterned beam of radiation;
  projecting the beam of radiation onto a target portion of a substrate;
  deriving an additional pattern based on the pattern of the patterning device and on lithographic projection apparatus property data, the lithographic projection apparatus property data characterizing a level and nature of one or more systematic perturbation factors of a different lithographic apparatus;
  conditioning an additional beam of radiation provided by an additional exposure system;
  imparting the additional beam of radiation with the additional pattern in its cross-section so as to form an additional patterned beam of radiation; and
  projecting the additional patterned beam of radiation onto the target portion of the substrate.

17. The method according to claim 16, wherein the deriving an additional pattern is further based on resist property data, the resist property data characterizing resist provided on the target portion of the substrate.

18. The method according to claim 17, wherein the resist property data comprises at least one resist property selected from a group consisting of contrast, sensitivity, and spectral response on actinic wavelength.

19. The method according to claim 16, wherein deriving an additional pattern includes:
  receiving pattern data;
  receiving the lithographic projection apparatus property data;
  calculating radiation modulation data on the basis of the pattern data and the lithographic projection apparatus property data, the radiation modulation data being suitable to form the additional pattern.

20. The method according to claim 19, wherein the calculating radiation modulation data includes:
  performing a Fourier transform on the pattern data to form transform data; passing the transform data through a low-pass filter so as to form low-pass transform data;
  providing lithographic projection apparatus property data in the form of a stray radiation profile and/or a source power spectrum;
  calculating further low-pass transform data based on the low-pass transform data and the respective stray radiation profile and/or the source power spectrum; and
  performing an inverse Fourier transform on the low-pass transform data and the further low-pass transform data to form the radiation modulation data.

21. The method according to claim 19, wherein pattern data is Graphic Data System II data.

22. The method according to claim 16, wherein the projecting of the additional beam of radiation is performed out of focus by moving an element within the lithographic projection apparatus.

23. The method according to claim 16, wherein the deriving an additional pattern from the pattern of the patterning device, the conditioning an additional beam of radiation, the imparting the additional beam of radiation with the additional pattern to form an additional patterned beam of radiation and projecting the additional patterned beam of radiation onto the target portion of the substrate are performed before or at the same time as the conditioning a beam of radiation.

24. A non-transitory computer readable medium comprising computer executable code, which, when loaded on a computer assembly, enables the computer assembly to control the method according to claim 16.

* * * * *